United States Patent [19]
Eimori

[11] Patent Number: 5,442,212
[45] Date of Patent: Aug. 15, 1995

[54] SEMICONDUCTOR MEMORY DEVICE
[75] Inventor: Takahisa Eimori, Hyogo, Japan
[73] Assignee: Mitsubishi Denki Kabushiki Kaisha, Tokyo, Japan
[21] Appl. No.: 292,303
[22] Filed: Aug. 18, 1994
[30] Foreign Application Priority Data Aug. 31, 1993 [JP] Japan .................................. 5-215869

[51] Int. Cl.6 .............................................. H01L 29/68
[52] U.S. Cl. ................................ 257/303; 257/306; 257/309; 257/390; 257/401; 257/774
[58] Field of Search ............... 257/303, 306, 309, 390, 257/401, 774

[56] References Cited

U.S. PATENT DOCUMENTS 5,324,975  6/1994  Kumagai et al. ................... 257/390

FOREIGN PATENT DOCUMENTS 4-279055  10/1992  Japan .
5-29579   2/1993   Japan .

OTHER PUBLICATIONS

"A 1.28 μm² Bit-Line Shielded Memory Cell Technology for 64 Mb DRAMS", Kawamoto et al., 1990 Symposium on VLSI Technology, pp. 13–14.
"Bidirectional Matched Global Bit Line Scheme for High Density DRAMS", Ahn et al., VLSI Circuit 1993, pp. 91–92.

*Primary Examiner*—Edward Wojciechowicz
*Attorney, Agent, or Firm*—Lowe, Price, LeBlanc & Becker

[57] ABSTRACT

In a semiconductor memory device, pitch of bit lines is made larger than pitch of word lines, and a storage node contact is positioned in each rectangular area surrounded by the bit lines and the word lines. The distance between centers of adjacent storage node contacts and the distance between centers of a bit line contact and an adjacent storage node contact are both made larger than the pitch of word lines. By this structure, planar area per unit memory cell can be increased, registration margin between the storage node and the storage node contact can be enlarged, short-circuit between the bit line and the storage node contact is prevented, and thus a memory cell structure of high production yield and high reliability can be realized.

14 Claims, 11 Drawing Sheets

SEMICONDUCTOR MEMORY DEVICE

BACKGROUND OF THE INVENTION

1. Field of the Invention

The present invention relates to a semiconductor memory device and, more particularly to a DRAM (Dynamic Random Access Memory) having a stacked type capacitor.

2. Description of the Background Art

A DRAM is one of semiconductor memory devices allowing random input/output of stored information. Recently, the semiconductor technology, especially microprocessing technology have developed and, as a result, the degree of integration and storage capacity of the DRAM have been much increased.

As the degree of integration of a DRAM is increased, the area of a capacitor storing information (charges) has been decreased, resulting in erroneous reading of the stored memory content, or resulting in soft errors due to destruction of the stored content caused by α ray, for example.

As a method of solving such problems and to realize higher degree of integration and larger storage capacity, a memory cell including a so-called stacked type capacitor has been proposed, in which a capacitor is formed on a memory cell area, and a lower electrode of the capacitor is electrically connected to one electrode of a switching transistor formed on a semiconductor substrate, so as to substantially increase the area occupied by the capacitor.

FIGS. 9 to 11 show memory cells of a DRAM having conventional typical stacked type capacitors. Referring to these figures, a memory cell includes one transfer gate transistor portion and one stacked type capacitor portion. The transfer gate transistor portion includes a pair of source/drain regions 6 formed on a surface of a silicon substrate 1, and a word line 4 serving as a transfer gate, formed on the surface of silicon substrate 1 with an insulating film posed therebetween. The stacked type capacitor portion includes a storage node (lower electrode) 11 extending from above word line 4 to above a field insulating film 2 with a portion thereof connected to one side of source/drain regions 6, a dielectric layer 12 formed on the surface of storage node 11, and a cell plate (upper electrode) formed on the surface of the dielectric layer 12. Further, a bit line 15 is formed above the capacitor, with an interlayer insulating film 20 posed therebetween. Bit line 15 is connected to the other one of source/drain regions 6 of the transfer gate transistor through a bit line contact 16. The feature of the stacked type capacitor is that as the main portion of the capacitor extends above the gate electrode and the field insulating film, opposing area between capacitor electrodes is increased so that desired capacitor capacitance is ensured.

Recently, one such stacked type capacitor, in which the opposing area of the upper and lower electrodes of the capacitor is further increased by extending the main portion of the capacitor further to a portion above the bit line contact with the lower electrode of the capacitor positioned above the bit line, has been proposed, as the element has been more and more miniaturized in accordance with the higher degree of integration (for example, see 1990 *Symposium on VLSI Technology*, p. 13, or Japanese Patent Laying-Open No. 5-29579).

FIGS. 12 and 14 are typical plan views of memory cells in which such capacitor portions are formed above the bit lines, and FIG. 13 is a cross section taken along the line XIII—XIII of FIG. 12. Two common features of these examples are as follows.

(1) A storage node contact 17 which is a lower electrode contact of the capacitor is formed in each space surrounded by word lines 4 and bit lines 15.

(2) An active region 2a is arranged diagonally with respect to word lines 4 so that storage contact 17 of (1) above and a bit line contact 16 serve as source/drain regions.

The pitch of the word lines and the pitch of the bit lines are designed to be approximately equal, in order to arrange memory cells with highest density.

However, the following problems arise when the degree of integration and storage capacity of the DRAM are to be increased by using the memory cells having the capacitor portion formed above the bit line as in the above described prior art.

(1) Increased Leak Between Memory Cells

As the elements are miniaturized in accordance with higher degree of integration, the space between adjacent active regions comes to be narrower and narrower, and as a result, the field oxide film comes to have lower isolation capability. Especially between adjacent active regions where storage node contacts are arranged with the minimum pitch which is approximately the same as that of the word lines, the isolation becomes inferior to that in active regions where there is no storage node contact. This is caused by diffusion of impurities contained in the storage node into active regions through a storage node contact, and by undesired scraping of end portions of the field oxide film when the contact hole for the storage node contact is provided by etching, due to inaccuracy in registration.

(2) Inaccuracy in Registration of Storage Node and Storage Node Contact

In such a memory cell that has the capacitor portion provided above the bit line, the depth from the storage node to the active region (source/drain region) becomes longer than in a structure in which the capacitor portion is provided below, since the bit line and the interlayer insulating film above the bit line, as well as the word line and the interlayer insulating film above the word line are stacked on the lower side of the storage node. Therefore, when a contact hole for providing the storage node contact is to be opened, etching must be effected for a longer period of time. At the time of etching the contact hole for the storage node contact, the opening diameter of the contact hole must be larger at the upper portion than the bottom portion in order to provide a desired contact resistance at the bottom portion of the contact hole. For this reason, registration margin in the step of forming a storage node subsequent to the formation of the storage node contact is made very severe. If the storage node contact happens to be off the storage node region because of inaccuracy in registration of the storage node pattern, the inside of the storage node contact may also be etched when the storage node is patterned by etching, resulting in increased contact resistance. If the substrate itself is further scraped by undesired etching, rapid increase in junction leak may result, lowering reliability.

(3) Short-Circuit Between Storage Node Contact and Bit Line

If a storage node contact is opened tapered widely as mentioned in (2) above, there would be high possibility of short-circuit between the bit line formed above the word line and the storage node contact, resulting in lower production yield.

FIG. 15 shows an example of a conventional DRAM memory cell which has been proposed as solving the above described prior art problems. The planar layout of the conventional memory cell is shown in 1993 *Symposium on VLSI Circuits*, pp. 91–92.

In the prior art example shown in FIG. 15, the pitch of word lines 4 and the pitch of bit lines 15 satisfy the ratio of 2:3, and in each of rectangular regions surrounded by word lines 4 and bit lines 15, one storage node contact 17 is positioned. In this planar layout, distance between centers of storage node contacts 17 adjacent in the lateral direction (D in FIG. 15) is larger than the pitch 2 F of the word lines 4. However, minimum distance between centers of storage node contacts 17 adjacent in the longitudinal direction, and the distance between centers of a bit line contact 16 and nearest storage contact 17 are both approximately equal to the pitch 2 F of word lines 4. Therefore, even in the planar layout of the prior art example shown in FIG. 15, the distance between centers of contacts is not sufficient, failing to provide sufficient isolation between adjacent active regions 11.

Here, the letter F used for representing the distance between centers of contacts and pitch of word lines 4 or bit lines 15 is generally referred to as "feature size", which is minimum processable size in the design rule plus registration margin.

SUMMARY OF THE INVENTION

An object of the present invention is to provide a semiconductor memory device having a DRAM allowing increased isolation between memory cells, enlarged registration margin of storage node and storage node contact, and prevention of short-circuit between the bit line and the storage node contact so as to improve yield and reliability, without increasing area per one memory cell.

The above described object of the present invention can be attained by the semiconductor memory device in accordance with a first aspect of the present invention which has a structure including: a plurality of word lines arranged approximately parallel to each other; a plurality of bit lines arranged approximately orthogonal to the word lines and approximately parallel to each other; and a plurality of memory cells each including one transistor and one capacitor, with a lower electrode of the capacitor in each memory cell arranged above the bit line. In the semiconductor memory device, the pitch of bit lines is made larger than the pitch of word lines, in each of rectangular areas surrounded by the word lines and the bit lines, one bit line contact is positioned, and the distance between centers of lower electrode contacts of lower electrodes of adjacent capacitors and the distance between centers of each bit line contact and the lower electrode contact adjacent to the bit line contact are both made larger than the pitch of the word lines.

In the structure of the semiconductor memory device, since the distance between centers of mutually adjacent lower electrode contacts and the distance between centers of a bit line contact and an adjacent lower electrode contact are both set to be larger than the word line pitch, and therefore large space is ensured between adjacent contacts, thus preventing generation of leak current between contacts and improving isolation between memory cells.

In a preferred embodiment of the semiconductor memory device, a lower electrode contact is arranged to be positioned at each vertex of a regular hexagon with each bit line contact being the center. By such an arrangement, respective contacts come to be approximately uniformly distributed in a plane, and the minimum distance between centers of adjacent contacts can be maximized, resulting in improved isolation between adjacent memory cells.

In another preferred embodiment of the semiconductor memory device, the lower electrode of the capacitor has rectangular planar shape having a periphery along a rectangular area surrounded by the bit lines and the word lines and sides long along the direction of extension of the word lines and side shorter along the direction of extension of the bit lines. Since the lower electrode of the capacitor has such a planar shape, the opposing area between the upper and lower electrodes of the capacitor can surely be as large as in the conventional memory cell.

In a more preferred embodiment of the semiconductor memory device, the lower electrode contact of the capacitor is arranged on a side of one short side of the rectangular area surrounded by the bit lines and the word lines, the planar shape of the lower electrode of the capacitor is such that the width thereof in a half near the lower electrode contact is wider than in the remaining half, and adjacent lower electrodes are placed with their directions reversed alternately.

In this structure, the lower electrode of the capacitor has such a planar shape in that the width of a half nearer to the lower electrode contact is wider than the remaining half, whereby registration margin of the lower electrode contact and the lower electrode can be enlarged as compared with the conventional structure. Since mutually adjacent lower electrodes are arranged with the directions reversed alternately, that is, upper and lower sides of the planar shape reversed alternately, large opposing area between the upper and lower electrodes of the capacitor can be ensured.

By this arrangement, respective contacts are approximately uniformly distributed in the plane, and the minimum distance between centers of adjacent contacts can be maximized, resulting in improved isolation between adjacent memory cells.

Further, when the planar shape of the lower electrode of the capacitor is made approximately circular, it can be easily formed, and registration margin between the lower electrode contact and the lower electrode can be more easily ensured.

Further, when the lower electrode of the capacitor is adapted to have cylindrical sidewall, for example, larger opposing area between the lower and upper electrodes of the capacitor can be ensured without changing the planar area per unit memory cell.

In the semiconductor memory device according to a second aspect of the present invention, in addition to the structure of the semiconductor memory device in accordance with the first aspect described above, the lower electrode of the capacitor has a rectangular planar shape having a periphery along an enlarged area surrounded by the bit lines and the word lines, sides longer along the direction of extension of the word lines and shorter in the direction of extension of the bit lines, and the lower electrode of the capacitor further has at its periphery a sidewall extending cylindrically upward.

In accordance with this structure, similar function and effects as the semiconductor memory device in accordance with the first aspect can be obtained and, in addition, the opposing area between the lower and upper electrodes of the capacitor can be made as large as in the conventional memory cell, and opposing area between the upper and lower electrodes of the capacitor can be always kept large without changing the planar area per unit memory cell.

The semiconductor memory device in accordance with a third aspect of the present invention includes, in addition to the basic structure similar to that of the semiconductor memory device in accordance with the first aspect, the following features. Namely, the lower electrode contact of the capacitor is arranged near one shorter side in the rectangular area surrounded by the bit lines and word lines, the planar shape of the lower electrode of the capacitor is such that the width thereof is wider in a half nearer to the lower electrode contact than in the remaining half, and adjacent lower electrodes are arranged with their directions reversed alternately. Further, in the periphery of the lower electrode of the capacitor, a sidewall extending cylindrically upward is provided.

According to this structure, the registration margin of the lower electrode contact and the lower electrode of the capacitor and opposing area between upper and lower electrodes of the capacitor can be both enlarged as compared with the prior art structure, and the opposing area between the lower and upper electrodes of the capacitor can be enlarged without changing the planar area per unit memory cell.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A first embodiment of the present invention will be described with reference to FIGS. 1A, 1B to 3. In the semiconductor memory device of the present embodiment, referring to FIGS. 1A, 1B to 3, a plurality of word lines 4 which will be transfer gates are arranged in the longitudinal direction, parallel to each other with the pitch of 2F. The letter F represents the feature size mentioned above. Above the word lines 4, a plurality of bit lines 15 are arranged approximately orthogonal to the word lines 4 and approximately parallel to each other, with the pitch of 4 F. An active region 2a surrounded by a field isolation film 2 is formed along a direction diagonal with respect to the word lines 4 and to the bit lines 15 as shown by the two dotted line in FIG. 1A.

Figure 1A:
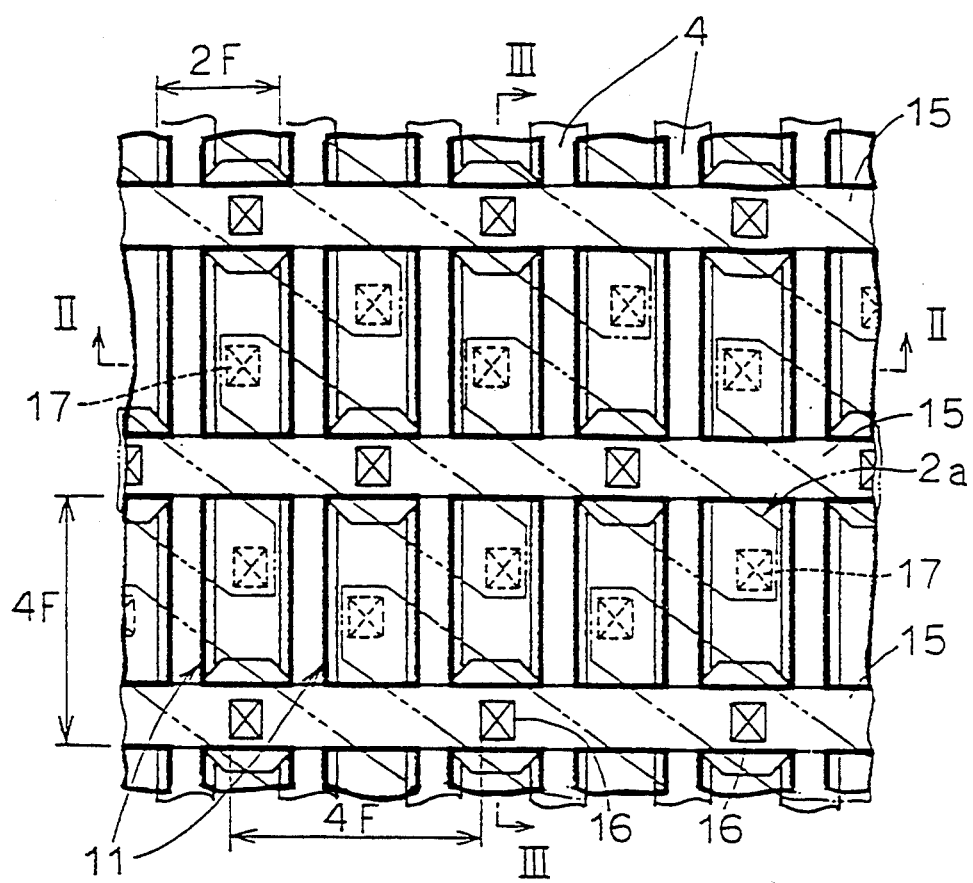
FIG. 1A is a planar layout of a semiconductor memory device in accordance with a first embodiment of the present invention.
Figure 12:
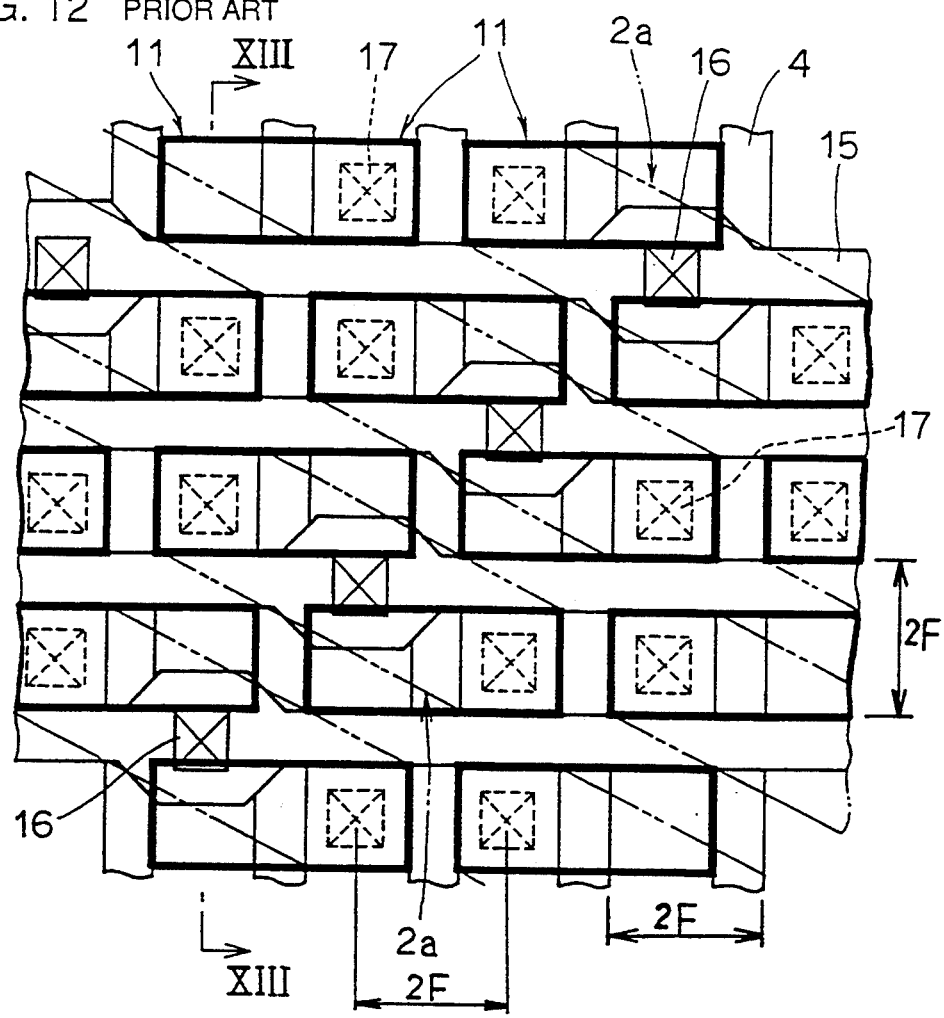
FIG. 12 is a planar layout of a conventional DRAM having stacked type memory cells in which the bit line is provided lower than the storage node.
Figure 13:
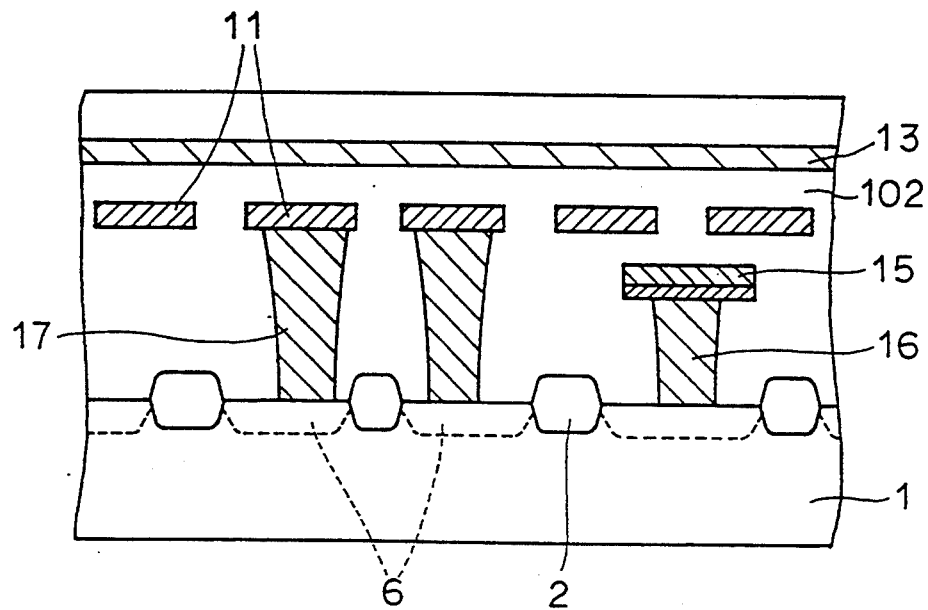
FIG. 13 is a cross section taken along the line XIII—XIII of FIG. 12.
Figure 14:
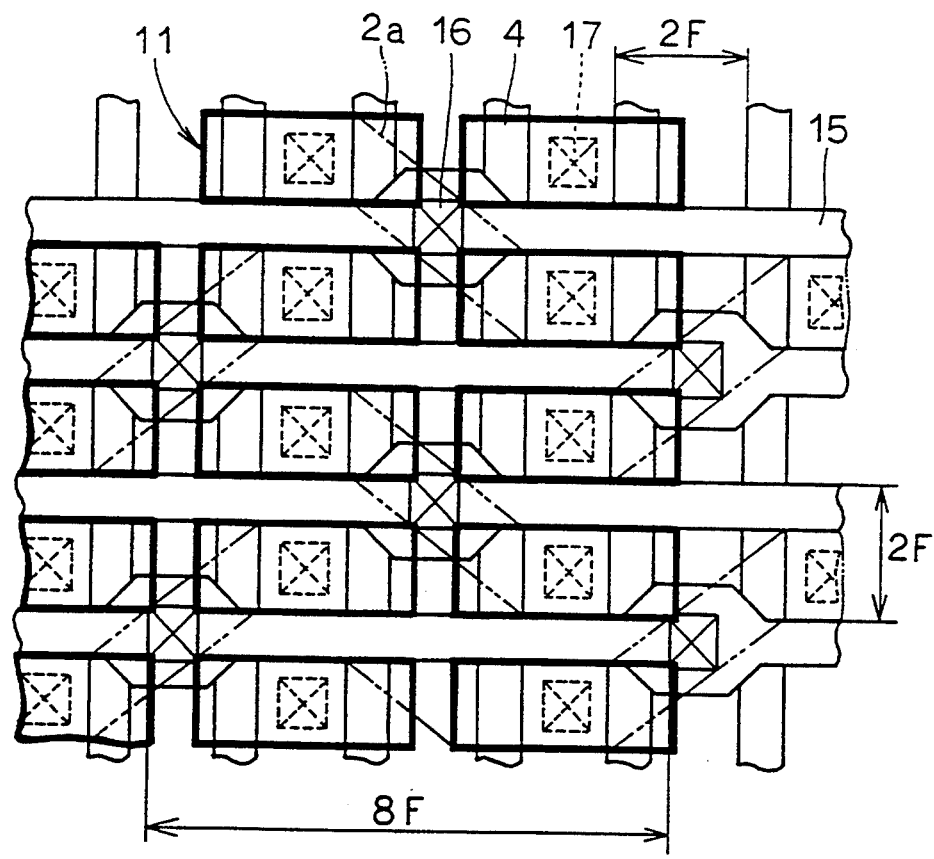
FIG. 14 is a planar layout showing another example of a conventional DRAM having memory cells in which the bit line is provided lower than the storage node.

In this embodiment, as shown in FIG. 1A, the planar shape of the area surrounded by the word lines 4 and the bit lines 15 has a planar shape of elongate rectangle, and margin in arranging the storage node contact 17 becomes larger in the longitudinal direction of the rectangular area, as compared with the conventional semiconductor memory device shown in FIGS. 12 or 14 in which the corresponding area has square shape. The storage contacts 17 of the present embodiment are arranged to be positioned at respective vertexes of a regular hexagon with a bit line contact 16 serving as the center, utilizing the margin. The distance between adjacent bit line contacts of the bit lines 15 described above is 8 F in the prior art shown in FIGS. 12 or 14. By contrast, in the present embodiment, the distance is reduced to a half, that is, 4 F. Since such as structure is employed, in the semiconductor memory device of the present embodiment, the area per unit memory cell is 4 F×2 F=8 F$^2$, that is the same as the prior art shown in FIGS. 12 or 14.

The storage node 11 is arranged in every rectangular area surrounded by the word lines 4 and bit lines 15 on each storage node contact 16, and it has rectangular planar shape which is approximately the same as said rectangular area.

Figure 1B:
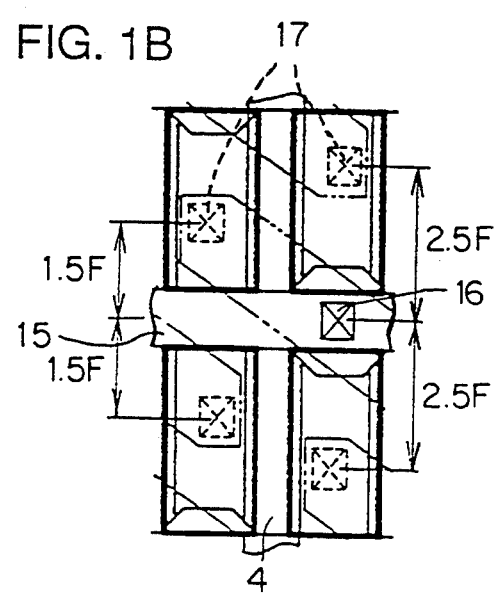
FIG. 1B shows a part of FIG. 1A, illustrating distance between centers of contacts.
Figure 2:
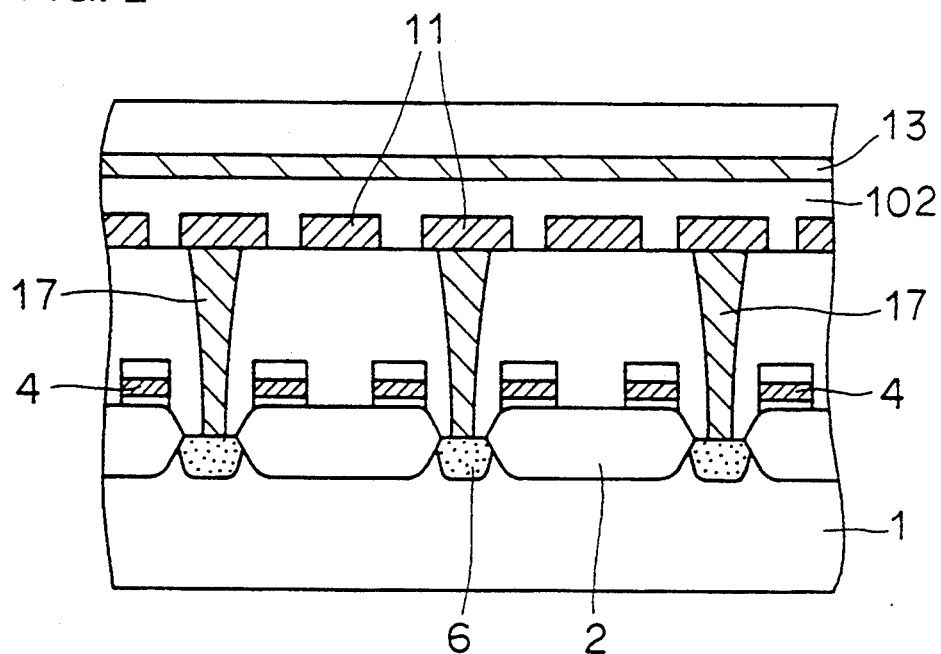
FIG. 2 is a cross section taken along the line II—II of FIG. 1A.
Figure 3:
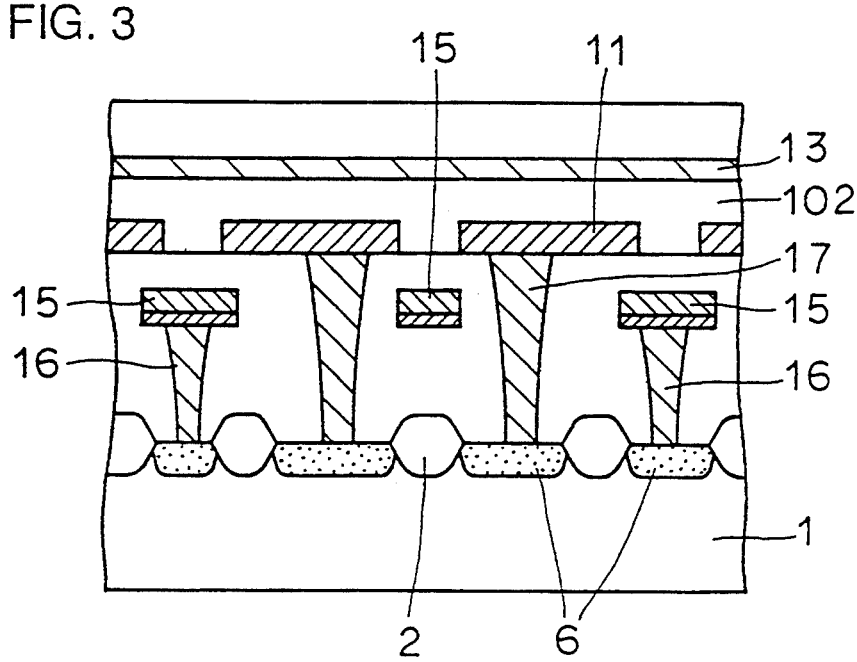
FIG. 3 is a cross section taken along the line III—III of FIG. 1A.
Figure 15:
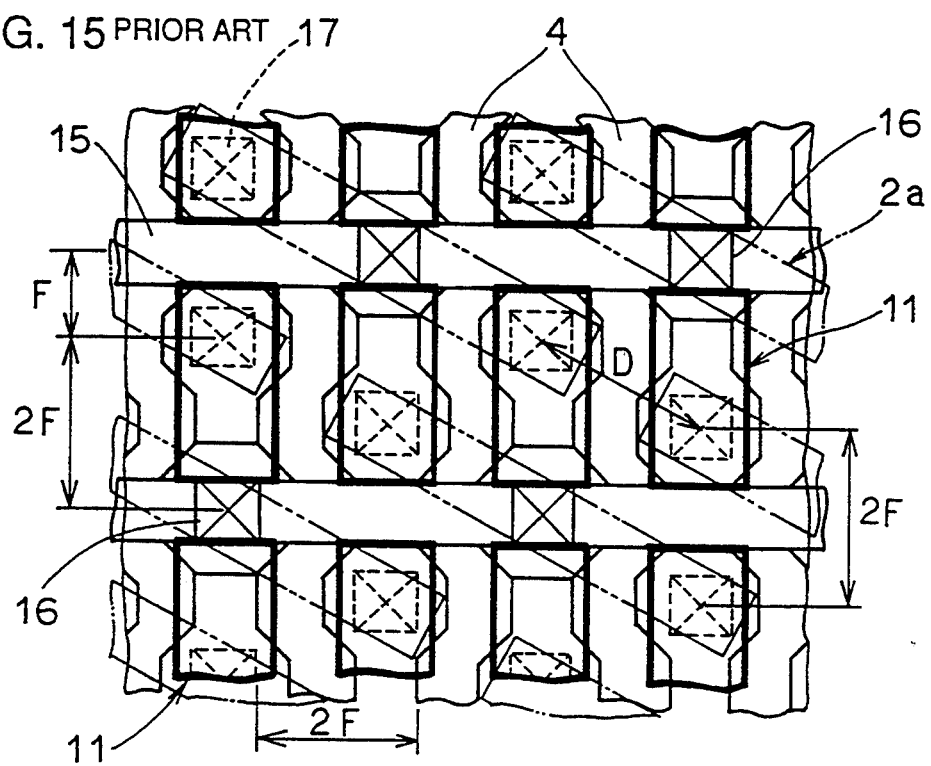
FIG. 15 is a planar layout showing a conventional DRAM in which ratio between the pitch of word lines and the pitch of bit lines is set to 2:3 and one storage node contact is positioned in each of the rectangular areas surrounded by the word lines and the bit lines.

In the semiconductor memory device of the present embodiment, the distance between adjacent storage node contact 17 can be made larger than 2 F, while the distance between adjacent storage node contact 17 in the conventional semiconductor memory device shown in FIGS. 12 or 14 is 2 F. As a result, the effective length of isolation between memory cells determined by the distance between the storage node contacts 17 can be made as long as that of the prior art shown in FIG. 15, thereby providing improved isolation between memory cells. Further, in the present embodiment, the minimum distance between the center of the bit line 15 and the center of the storage node contact 17 is 1.5 F and the distance between centers of longitudinally adjacent storage node contacts 17 is 3.0F, as shown in FIG. 1B. The minimum value of the distance between centers of the bit line contact 16 and the storage node contact 17 is 2.5 F, which is larger than the pitch 2 F of the word lines 4. Therefore, according to the present embodiment, not only the distance between centers of laterally adjacent storage node contacts 17 but also the minimum value of the distance between centers of all the contacts can be surely made larger than the pitch of the word lines 4, preventing generation of the leak current between contacts, and improving isolation between adjacent memory cells.

Figure 4:
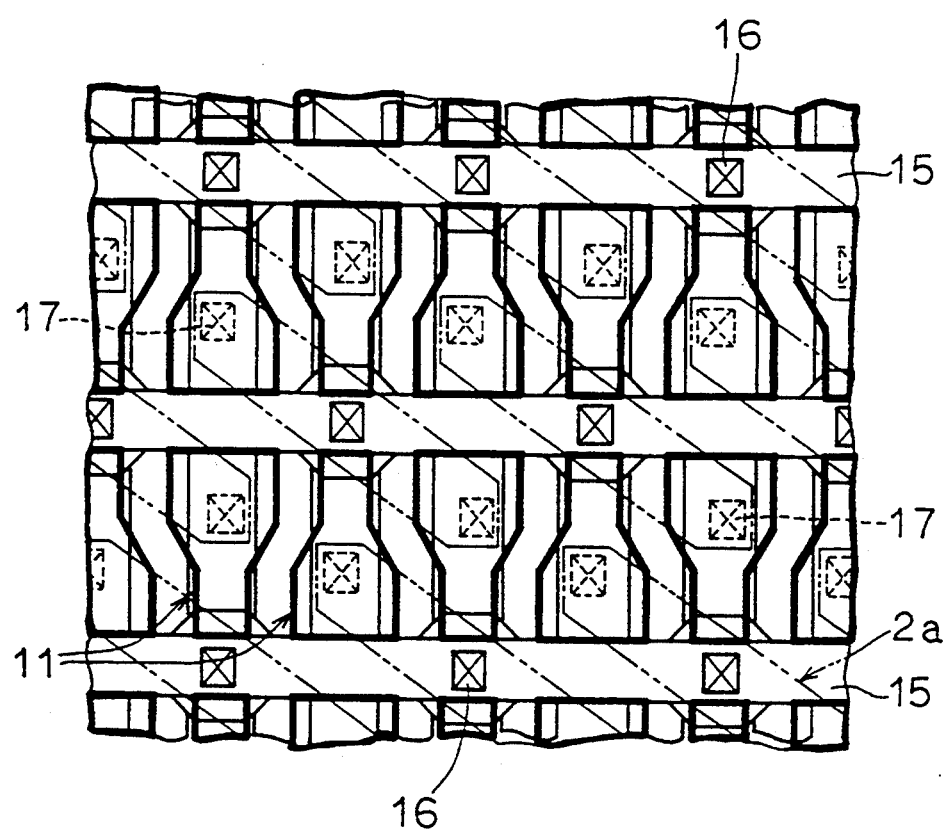
FIG. 4 is a planar layout of a semiconductor memory device in accordance with a second embodiment of the present invention.

A second embodiment of the present invention will be described with reference to FIG. 4. In this embodiment, pitches of word lines 4 and bit lines 15, arrangement of bit line contacts 16 and storage node contacts 17, arrangement of active regions 2a are similar to those of the first embodiment described above. The present embodiment differs from the first embodiment in that the planar shape of the storage node 11 is wider in a half on the upper side of the storage node contact 17 than in the remaining half. The planar shapes of storage nodes 11 adjacent in longitudinal and lateral directions are reverse to each other, and planar area of each storage node 11 is maintained approximately the same as that of the first embodiment.

As the storage node 11 of the present embodiment has such a shape, the difference in planar area between the storage node contact 17 and the storage node 11 thereabove comes to be larger. Therefore, according to the present embodiment, the registration margin of the storage node 11 and the storage node contact 17 can be enlarged as compared with the first embodiment without changing the planar area of the storage node 11, that is, without changing the capacitor capacitance, and therefore inaccuracy in registration of the storage node contact 17 and the storage node 11 during the steps of manufacturing can be suppressed.

Figure 5:
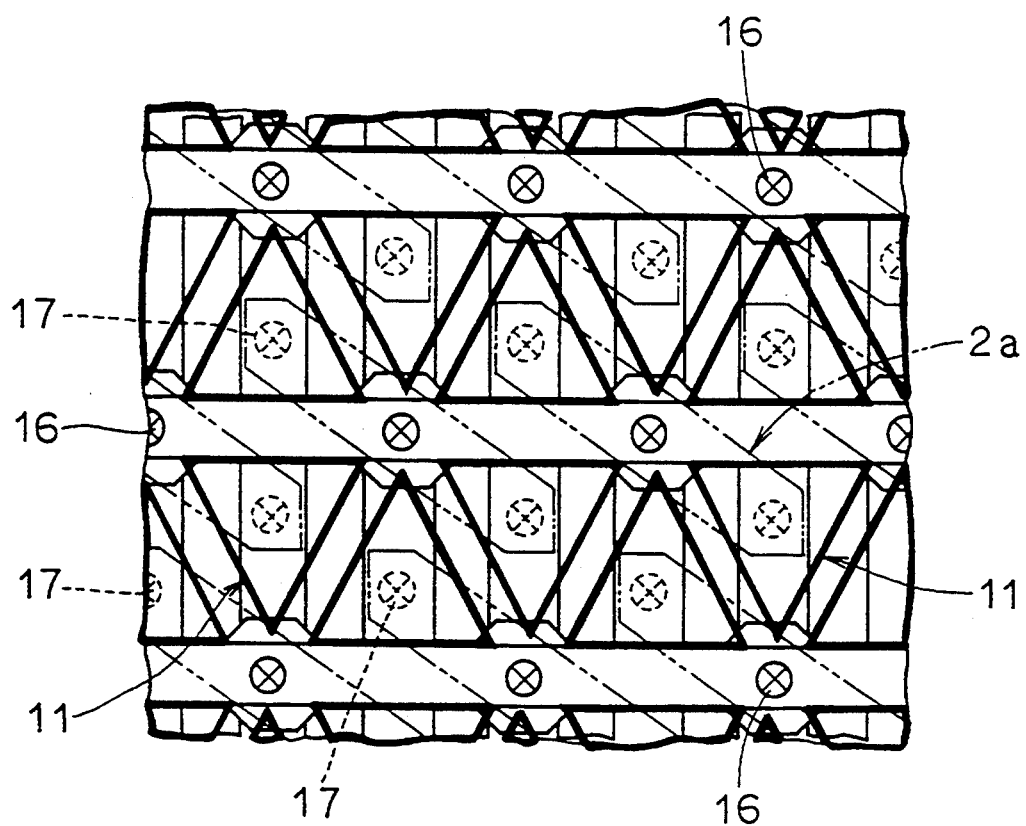
FIG. 5 is a planar layout of a semiconductor memory device in accordance with a third embodiment of the present invention.

A third embodiment of the present invention will be described with reference to FIG. 5. In this embodiment, pitches of word lines 4 and bit lines 15, arrangements of bit line contacts 16 and storage node contacts 17, arrangement of active regions 2a are the same as those in the first and second embodiments above. This embodiment differs from the first and second embodiments in that the planar shape of the storage node 11 is approximately regular triangle. The planar shape of longitudinally and laterally adjacent storage nodes 11 are regular triangles with the top and bottom reversed alternately, and that each storage node contact 17 is positioned approximately at the center of the regular triangle of each storage node 11. In this embodiment also, the planar area of each storage node 11 is maintained approximately the same as that of the first and second embodiments, and the capacitor capacitance is similarly ensured.

According to this embodiment, similar effect as in the second embodiment, that is, larger registration margin between the storage node contact 17 and the storage node 11 can be obtained without changing the capacitor capacitance, by the storage node 11 having more simple planar shape as compared with the second embodiment.

Figure 6:
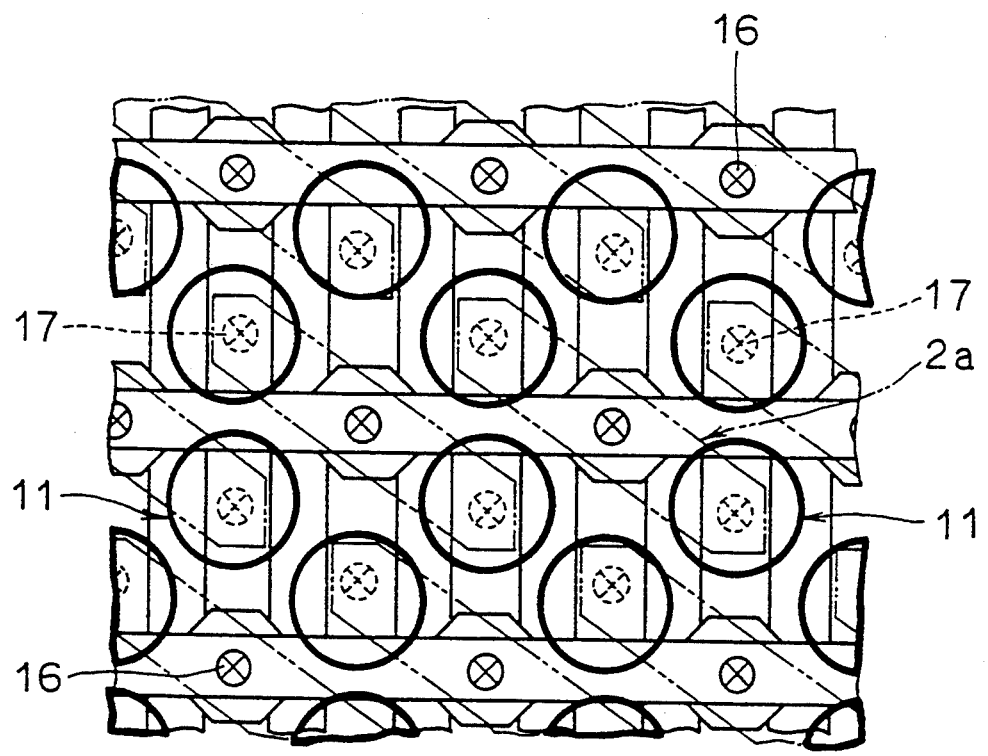
FIG. 6 is a planar layout of a semiconductor memory device in accordance with a fourth embodiment of the present invention.
Figure 7A:
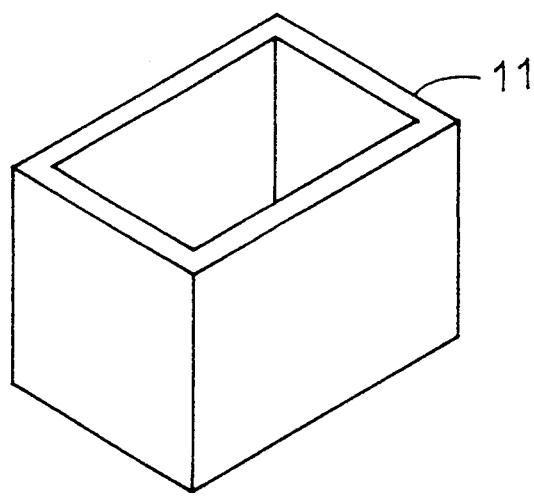
FIGS. 7A, 7B, 7C and 7D are perspective views showing four different examples of storage node sidewalls in a semiconductor memory device in accordance with a fifth embodiment of the present invention.
Figure 7B:
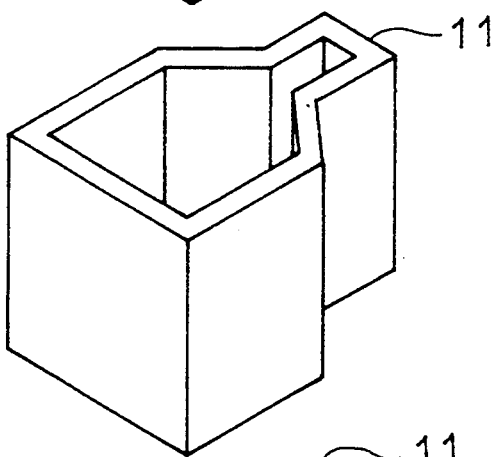
Figure 7C:
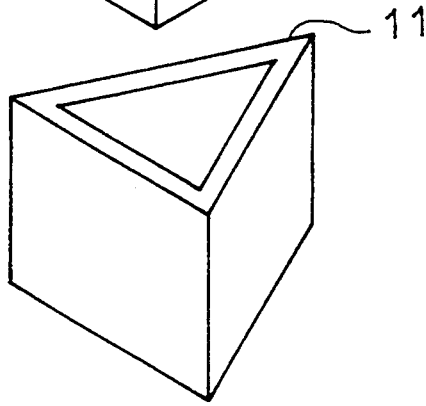
Figure 7D:
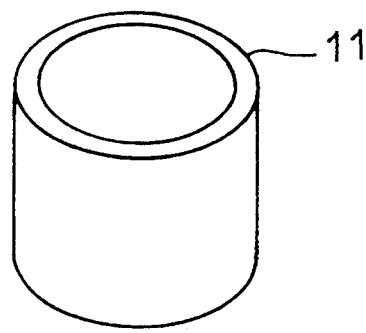
Figure 8A:
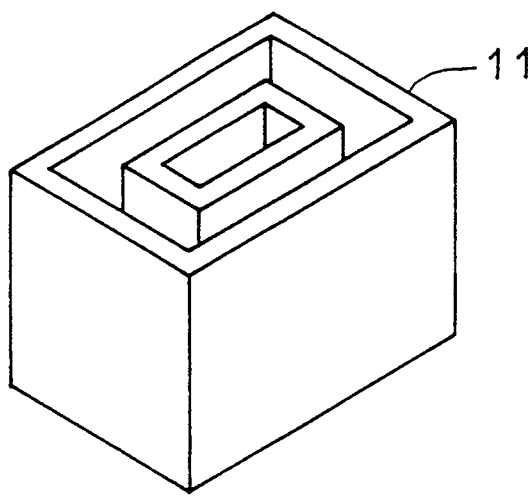
FIGS. 8A, 8B, 8C and 8D are perspective views showing four different examples of storage node sidewalls in a semiconductor memory device in accordance with a sixth embodiment of the present invention.
Figure 8B:
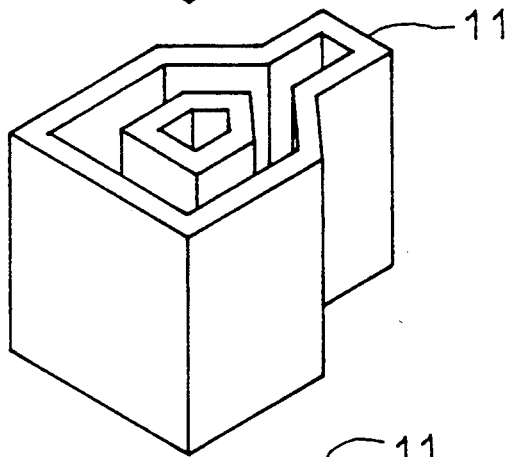
Figure 8C:
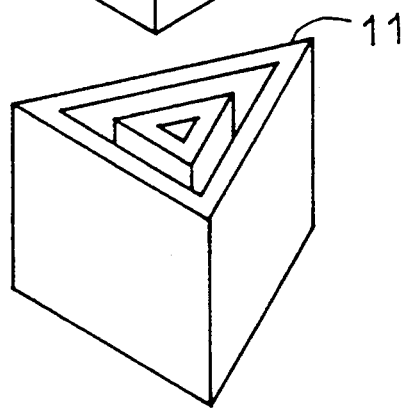
Figure 8D:
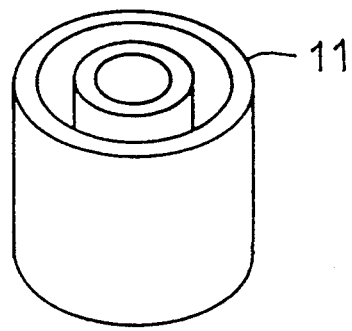
Figure 9:
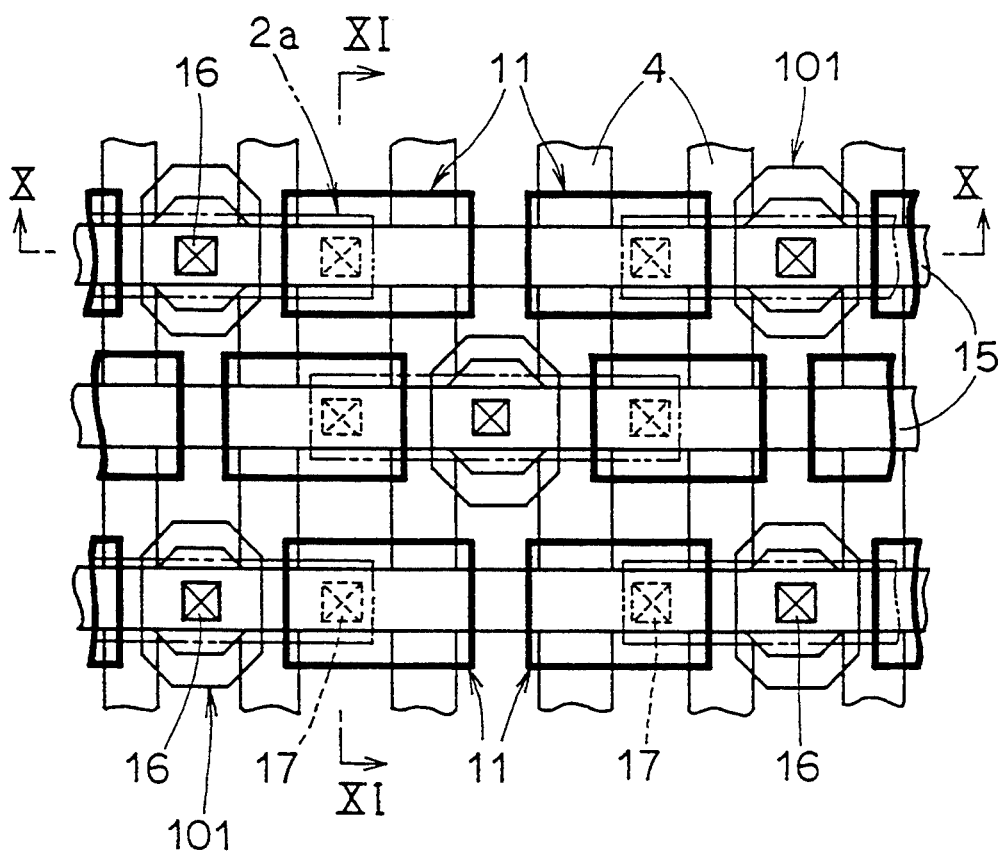
FIG. 9 is a planar layout of a DRAM having a conventional general stacked type memory cell.
Figure 10:
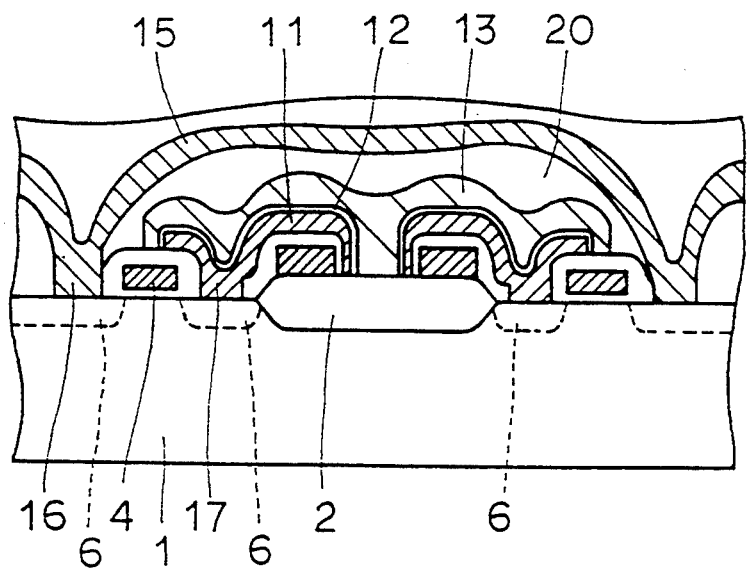
FIG. 10 is a cross section taken along the line X—X of FIG. 9.
Figure 11:
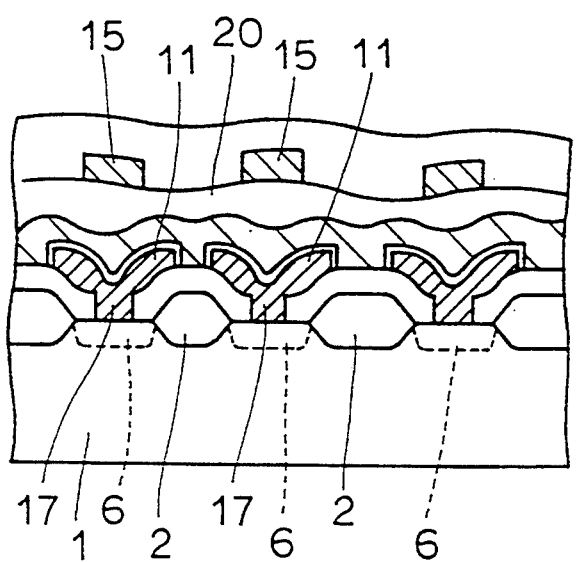
FIG. 11 is a cross section taken along the line XI—XI of FIG. 9.

A fourth embodiment of the present invention will be described with reference to FIG. 6. This embodiment is similar to the first to third embodiments above except that the storage node 11 has approximately circular planar shape. Each circular storage node 11 is arranged such that the storage node contact 17 is positioned approximately at the center thereof.

According to this embodiment, the planar area of each storage node 11 is inevitably made smaller than in the first to third embodiments. However, since it is circular, it can be very easily manufactured, and in view of registration margin between the storage node contact 17 and the storage node 11, similar effects as in the second and third embodiments can be obtained.

A fifth embodiment of present invention will be described with reference to FIG. 7. In this embodiment, pitches of word lines 4 and bit lines 15, arrangement of bit line contacts 16 and storage node contacts 17 and arrangement of active regions 2a are the same as those of the first to fourth embodiments. This embodiment differs from the above described embodiments in that a sidewall extending upward and surrounding each storage node 11 is provided. Shapes of the sidewalls are as shown in FIGS. 7A to 7D. FIGS. 7A to 7D correspond to the storage nodes 11 having the shapes defined in the first to fourth embodiments above, with sidewalls surrounding the periphery being provided.

According to this embodiment, since a sidewall surrounding the storage node 11 is provided, the planar area of the storage node 11 can be enlarged without changing the surface area per unit memory cell. As a result, opposing area between storage node 11 and cell plate 13 can be enlarged, increasing the capacitor capacitance.

A sixth embodiment of the present invention will be described with reference to FIG. 8. This embodiment differs from the fifth embodiment in that in each storage node 11, an additional sidewall surrounding the periphery is provided inside the sidewall of the fifth embodiment, which additional sidewall is concentric with and approximates to the sidewall of the fifth embodiment. FIGS. 8A to 8D of the present embodiment correspond to the shapes of the storage nodes 11 of the first to fourth embodiments, respectively.

According to this embodiment, since the storage node 11 has double sidewalls, the planar area of the storage node 11 can be further increased as compared with the fifth embodiment, without changing the surface area of unit memory cell. As a result, opposing area between the storage node 11 and cell plate 13 can be further enlarged, resulting in increased capacitor capacitance.

As described above, according to the embodiments described above, since the bit line pitch is made larger than the word line pitch, and the storage contact is arranged in a rectangular area surrounded by the bit lines and word lines such that the distance between centers of adjacent storage node contacts and the distance between the center of a bit line contact and the center of an adjacent storage node contact are both larger than the word line pitch, the area per unit memory cell can be increased and separation between memory cells can be improved.

Further, each storage node is adapted to have such a planar shape that is wider on the upper side of the storage node contact than the remaining portion and adjacent storage nodes are arranged with the directions reversed alternately, registration margin between the storage node and the storage node contact can be enlarged without decreasing the capacitor capacitance. Further, short-circuit between the bit line and the storage node contact can be prevented. As a result, a memory cell structure of a DRAM having improved yield of manufacturing and high reliability can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, including
a plurality of word lines arranged approximately parallel to each other,
a plurality of bit lines approximately orthogonal to the word lines and approximately parallel to each other, and
a plurality of memory cells each including one transistor and one capacitor,
said capacitor of said each memory cell having a lower electrode arranged above said bit lines, wherein
pitch of said bit lines is set to be larger than pitch of said word lines and one bit line contact is arranged in each rectangular area surrounded by said word lines and said bit lines, and that
distance between centers of lower electrode contacts of said lower electrodes of adjacent said capacitors and distance between centers of said bit line contact and said lower electrode contact adjacent to said bit line contact are both made larger than the pitch of said word lines.

2. The semiconductor memory device according to claim 1, wherein
said lower electrode contact is arranged at each vertex of a rectangular hexagon with said bit contact being the center.

3. The semiconductor memory device according to claim 1, wherein
said lower electrode of said capacitor has a rectangular planar shape having a periphery along said rectangular area surrounded by said bit lines and said word lines, and having sides long in a direction of extension of said word lines and short in a direction of extension of said bit lines.

4. The semiconductor memory device according to claim 1, wherein
said lower electrode contact of said capacitor is arranged near one short side of the rectangular area surrounded by said bit lines and said word lines, and
said lower electrode of said capacitor has such a planar shape that is wider in a half nearer to said lower electrode contact than in remaining half, and adjacent said lower electrodes are arranged with their directions reversed alternately.

5. The semiconductor memory device according to claim 4, wherein
the planar shape of said lower electrode of said capacitor is approximately regular triangle.

6. The semiconductor memory device according to claim 5, wherein
the center of said lower electrode contact is positioned approximately at the center of gravity of said regular triangle constituting each of said lower electrodes.

7. The semiconductor memory device according to claim 1, wherein
the planar shape of said lower electrode of said capacitor is approximately circular.

8. The semiconductor memory device according to claim 1, wherein
said lower electrode of said capacitor has at its periphery a sidewall extending cylindrically upward.

9. The semiconductor memory device according to claim 8, wherein
said lower electrode of said capacitor further includes an additional sidewall inside said sidewall at its periphery, which additional sidewall is concentric with said sidewall and extending upward.

10. A semiconductor memory device, including
a plurality of word lines arranged approximately parallel to each other,
a plurality of bit lines approximately orthogonal to the word lines and approximately parallel to each other, and
a plurality of memory cells each including one transistor and one capacitor,
said capacitor of said each memory cell having a lower electrode arranged above said bit lines, wherein
pitch of said bit lines is set larger than pitch of said word lines, and one bit line contact is arranged in each rectangular area surrounded by said word lines and said bit lines,
distance between centers of lower electrode contacts of said lower electrodes of adjacent said capacitors and distance between centers of said bit line contact and said lower electrode contact adjacent to said bit line contact are both made larger than said pitch of said word lines,
said lower electrode of said capacitor has a rectangular planar shape having a periphery along said rectangular area surrounded by said bit lines and said word lines and sides long in a direction of extension of said word lines and short in a direction of extension of said bit lines, and
said lower electrode of said capacitor has at its periphery a sidewall extending cylindrically upward.

11. The semiconductor memory device according to claim 10, wherein
said lower electrode of said capacitor further includes an additional sidewall inside said sidewall at its periphery, which additional sidewall is concentric with said sidewall and extending upward.

12. A semiconductor memory device, including
a plurality of word lines arranged approximately parallel to each other,
a plurality of bit lines approximately to orthogonal to the word lines and approximately parallel to each other, and
a plurality of memory cells each including one transistor and one capacitor,
said capacitor of each said memory cell having a lower electrode positioned above said bit lines, characterized in that
pitch of said bit lines is set to be larger than pitch of said word lines, and one bit line contact is arranged in each rectangular area surrounded by said word lines and said bit lines,
distance between centers of lower electrode contacts of said lower electrodes of adjacent said capacitors and distance between centers of said bit line contact and said lower electrode contact adjacent to said bit line contact are both made to be larger than the pitch of said word lines, said lower electrode contact of said capacitor is arranged on one short side in the rectangular area surrounded by said bit lines and said word lines, said lower electrode of said capacitor has such a planar shape that is wider in a half nearer to said lower electrode contact than in remaining half, adjacent said lower electrodes being positioned with their directions reversed alternately, and said lower electrode of said capacitor has, at its periphery, a sidewall extending cylindrically upward.

13. The semiconductor memory device according to claim 12, wherein the planar shape of said lower electrode of said capacitor is approximately regular triangle.

14. The semiconductor memory device according to claim 17, wherein said lower electrode of said capacitor further includes an additional sidewall inside said sidewall at its periphery, which additional sidewall is concentric with said sidewall and extending upward.

* * * * *